(12) United States Patent
Zheng (10) Patent No.: US 10,551,263 B2
(45) Date of Patent: Feb. 4, 2020

(54) MEMS PRESSURE SENSING ELEMENT

(71) Applicant: GOERTEK. INC, Weifang, Shandong (CN)

(72) Inventor: Guoguang Zheng, Weifang (CN)

(73) Assignee: GOERTEK. INC, Weifang, Shandong (CN)

( * ) Notice: Subject to any disclaimer, the term of this patent is extended or adjusted under 35 U.S.C. 154(b) by 213 days.

(21) Appl. No.: 15/559,647

(22) PCT Filed: Dec. 10, 2015

(86) PCT No.: PCT/CN2015/096919
§ 371 (c)(1),
(2) Date: Sep. 19, 2017

(87) PCT Pub. No.: WO2017/000501
PCT Pub. Date: Jan. 5, 2017

(65) Prior Publication Data
US 2018/0335358 A1    Nov. 22, 2018

(30) Foreign Application Priority Data

Jun. 29, 2015    (CN) .......................... 2015 1 0368749

(51) Int. Cl.
*B81B 7/00*    (2006.01)
*G01L 9/00*    (2006.01)
(Continued)

(52) U.S. Cl.
CPC .......... *G01L 9/0072* (2013.01); *B81B 7/0064* (2013.01); *B81C 1/00166* (2013.01);
(Continued)

(58) Field of Classification Search
CPC ....... B81B 7/00; B81B 7/0029; B81B 7/0064; B81B 2201/0264; B81B 2203/0172;
(Continued)

(56) References Cited

U.S. PATENT DOCUMENTS

4,741,214 A *   5/1988   Vidmantas ............ G01L 9/0075
                                                361/283.3
5,349,492 A *   9/1994   Kimura ................. G01L 9/0075
                                                361/283.4
(Continued)

*Primary Examiner* — Nguyen Q. Ha (57) ABSTRACT

The present invention discloses an MEMS pressure sensing element, including a substrate provided with a groove; a pressure-sensitive film disposed above the substrate, the pressure-sensitive film sealing an opening of the groove to form a sealed cavity; and a movable electrode plate and a fixed electrode plate which are located in the sealed cavity and form a capacitor structure, wherein the fixed electrode plate is fixed on a bottom wall of the groove of the substrate, and the movable electrode plate is suspended above the fixed electrode plate and opposite to the fixed electrode plate; and the pressure-sensitive film is connected to the movable electrode plate so as to drive the movable electrode plate to move under the action of an external pressure. According to the MEMS pressure sensing element, pressure sensitivity and electrical detection are separated, the pressure-sensitive film is exposed in air, the capacitor structures are disposed in the sealed cavity defined by the pressure-sensitive film and the substrate, and the movable electrode plates of the capacitor structures can be driven by the pressure-sensitive film. In this way, not only is a pressure-sensitive function finished, but also external electromagnetic interferences on the capacitor structures are shielded.

9 Claims, 7 Drawing Sheets

(51) Int. Cl.
*G01L 9/12* (2006.01)
*G01L 19/06* (2006.01)
*B81C 1/00* (2006.01)

(52) U.S. Cl.
CPC ............... *B81B 2201/0264* (2013.01); *B81B 2203/0172* (2013.01); *B81B 2203/0307* (2013.01); *B81B 2203/0315* (2013.01); *B81B 2203/04* (2013.01); *B81B 2203/053* (2013.01); *B81B 2207/053* (2013.01)

(58) Field of Classification Search
CPC .... B81B 2203/0307; B81B 2203/0315; B81B 2203/04; B81B 2203/053; B81B 2207/053; B81C 1/00166; G01L 9/00; G01L 9/0072; G01L 9/12; G01L 19/06; G01L 19/069
See application file for complete search history.

(56) References Cited

U.S. PATENT DOCUMENTS

| | | | | |
|---|---|---|---|---|
| 6,122,973 | A * | 9/2000 | Nomura | G01L 9/0075 361/283.4 |
| 9,829,406 | B2 * | 11/2017 | Geisberger | G01L 9/0073 |
| 2002/0194919 | A1 * | 12/2002 | Lee | G01L 9/0042 73/718 |
| 2005/0200241 | A1 * | 9/2005 | Degertekin | B06B 1/0292 310/334 |
| 2009/0031809 | A1 * | 2/2009 | Lin | G01P 15/125 73/514.32 |
| 2010/0164023 | A1 * | 7/2010 | Knese | B81B 3/0086 257/415 |
| 2013/0118265 | A1 * | 5/2013 | Besling | G01L 9/0042 73/724 |
| 2014/0060169 | A1 * | 3/2014 | McNeil | B60C 23/0408 73/146.5 |

\* cited by examiner

MEMS PRESSURE SENSING ELEMENT

CROSS REFERENCE TO RELATED APPLICATION

This application is a national stage application, filed under 35 U.S.C. § 371, of International Application No. PCT/CN2015/096919, filed on Dec. 10, 2015, which claims priorities to Chinese Application No. 201510368749.6 filed on Jun. 29, 2015, the contents of which are hereby incorporated by reference in their entirety.

FIELD OF THE INVENTION

The present invention relates to the field of sensors, and more particularly, relates to a micro electro-mechanical system (MEMS) pressure sensing element.

BACKGROUND OF THE INVENTION

For existing MEMS pressure sensors, regardless of a piezoresistive or capacitive type, a pressure-sensitive film needs to be exposed in air; otherwise, the pressure-sensitive film cannot make a sensitive reaction to external air pressures. Such a pressure-sensitive film is applied generally as an electrical capacitance electrode plate or resistor, and because it must be exposed in air and cannot be disposed in a closed electrical cavity body, external electromagnetic interference will cause an influence on the output of the MEMS pressure sensor.

The existing capacitor-type MEMS pressure sensors mostly adopt a single capacitor detection manner. A pressure-sensitive film and a substrate form a sealed vacuum cavity. When external air pressures are changed, the pressure-sensitive film located above the vacuum cavity is bent. As a result, a capacitance formed by the pressure-sensitive film and the substrate will be changed, and external pressures can be obtained by detecting such capacitance changes.

The above capacitor-type MEMS pressure sensor can detect a change of the external pressures by a single capacitor. Generally speaking, a capacitance variable quantity caused by the change of the external air pressures is very small, and errors of detection carried out by adopting the single capacitor are very large. Besides, except for the external pressure change, other interference signals will also cause the capacitance change. For example, stress, temperature and other common-mode signals all will affect a change value of the capacitance. Detection by the single capacitor cannot filter external interference signals and will influence a noise level of output signals and reduce a signal to noise ratio.

Therefore, there is a demand in the art that a new solution to address at least one of the problems in the prior art.

SUMMARY OF THE INVENTION

One object of this invention is to provide a new technical solution for an MEMS pressure sensing element which can shield external electromagnetic interference outside capacitors.

According to a first aspect of the present invention, there is provided an MEMS pressure sensing element, comprising: a substrate provided with a groove; a pressure-sensitive film disposed above the substrate, the pressure-sensitive film sealing an opening of the groove to form a sealed cavity; and a movable electrode plate and a fixed electrode plate which are located in the sealed cavity and form a capacitor structure, wherein the fixed electrode plate is fixed on a bottom wall of the groove of the substrate, and the movable electrode plate is suspended above the fixed electrode plate and opposite to the fixed electrode plate; and the pressure-sensitive film is connected to the movable electrode plate so as to drive the movable electrode plate to move under the action of an external pressure.

Alternatively or optionally, the movable electrode plate comprises a first torsion mass block, a pressure conduction part and a second torsion mass block which are sequentially disposed in parallel, wherein the first torsion mass block and the second torsion mass block are symmetric about the pressure conduction part; the pressure conduction part is connected to the first torsion mass block by a first elastic connecting part, and is connected to the second torsion mass block by a second elastic connecting part; a central part of the pressure conduction part is fixedly connected to that of the pressure-sensitive film by a first anchoring point; a central part of the first torsion mass block is fixedly connected to the bottom wall of the groove of the substrate by a second anchoring point; and a central part of the second torsion mass block is fixedly connected to the bottom wall of the groove of the substrate by a third anchoring point.

Alternatively or optionally, the first elastic connecting part comprises a first elastic beam, first connecting arms and a second connecting arm; the second elastic connecting part comprises a second elastic beam, third connecting arms and a fourth connecting arm; the first elastic, beam and the second elastic beam are respectively parallel with the pressure conduction part; both ends of the first elastic beam are connected to the pressure conduction part by one first connecting arm respectively, and the middle of the first elastic beam is connected to the first torsion mass block by the second connecting arm; and both ends of the second elastic beam are connected to the pressure conduction part by one third connecting arm respectively, and the middle of the second elastic beam is connected to the second torsion mass block by the fourth connecting arm.

Alternatively or optionally, the first torsion mass block comprises a first rectangular frame structure and a third elastic beam; the first rectangular frame structure comprises a first movable electrode plate and a second movable electrode plate which are respectively parallel with the pressure conduction part, and two fifth connecting arms respectively perpendicular to the pressure conduction part; the third elastic beam is connected to midpoints of the two fifth connecting arms, and the center of the third elastic beam is fixedly connected to the bottom wall of the groove of the substrate by the second anchoring point; the second torsion mass block comprises a second rectangular frame structure and a fourth elastic beam; the second rectangular frame structure comprises a third movable electrode plate and a fourth movable electrode plate which are respectively parallel with the pressure conduction part, and two sixth connecting arms respectively perpendicular to the pressure conduction part; the fourth elastic beam is connected to midpoints of the two sixth connecting arms, and the center of the fourth elastic beam is fixedly connected to the bottom wall of the groove of the substrate by the third anchoring point; the fixed electrode plate comprises a first, a second, a third and a fourth fixed electrode plate, and the first, the second, the third and the fourth fixed electrode plate correspond to the first, the second, the third and the fourth movable electrode plate respectively to form a first, a second, a third and a fourth capacitor structure.

Alternatively or optionally, the first capacitor structure and the fourth capacitor structure are connected in parallel by a metal lead and form a first group of capacitors; the second capacitor structure and the third capacitor structure are connected in parallel by a metal lead and form a second group of capacitors; and the first group of capacitors and the second group of capacitors form a pair of differential capacitors.

Alternatively or optionally, the first torsion mass block comprises a first rectangular frame structure, a third elastic beam and a seventh connecting arm; the middle of the first rectangular frame structure away from one side of the pressure conduction part is provided with a first opening; the third elastic beam is located in the first rectangular frame, and the two ends thereof are respectively connected to opposite sides of the first rectangular frame structure perpendicular to the pressure conduction part; one end of the seventh connecting arm is connected to a midpoint of the third elastic beam, and the other end thereof extends out of the first rectangular frame from the first opening to be connected to the second anchoring point; the upper end of the second anchoring point is connected to the pressure-sensitive film and the lower end thereof is connected to the bottom wall of the groove of the substrate; the second torsion mass block comprises a second rectangular frame structure, a fourth elastic beam and an eighth connecting arm; the middle of the second rectangular frame structure away from one side of the pressure conduction part is provided with a second opening; the fourth elastic beam is located in the second rectangular frame, and the two ends thereof are respectively connected to opposite sides of the second rectangular frame structure perpendicular to the pressure conduction part; one end of the eighth connecting arm is connected to a midpoint of the fourth elastic beam, and the other end thereof extends out of the second rectangular frame from the second opening to be connected to the third anchoring point; and the upper end of the third anchoring point is connected to the pressure-sensitive film and the lower end thereof is connected to the bottom wall of the groove of the substrate.

Alternatively or optionally, the fixed electrode plate comprises a first, a second, a third and a fourth fixed electrode plate which are respectively located below four corners of the first rectangular frame, the first fixed electrode plate and the second fixed electrode plate are relatively away from the pressure conduction part, and the third fixed electrode plate and the fourth fixed electrode plate are relatively closer to the pressure conduction part; the fixed electrode plate further comprises a fifth, a sixth, a seventh and a eighth fixed electrode plate respectively located below four corners of the second rectangular frame, the fifth fixed electrode plate and the sixth fixed electrode plate are relatively closer to the pressure conduction part, and the seventh fixed electrode plate and the eighth fixed electrode plate are relatively away from the pressure conduction part; the first fixed electrode plate to the eighth fixed electrode plate and the torsion mass blocks on corresponding parts thereabove form the first capacitor structure to eighth capacitor structure, wherein the first, second, the seventh and the eighth capacitor structure are connected in parallel by a lead and form a first group of capacitors; and the third, the fourth, fifth and the sixth capacitor structure are connected in parallel by a lead and form a second group of capacitors; and the first group of capacitors and the second group of capacitors form a pair of differential capacitors.

Alternatively or optionally, the sealed cavity is further provided a limiting bulge part therein, and the limiting bulge part is disposed on the bottom wall of the groove of the substrate and below the pressure conduction part.

Alternatively or optionally, the pressure-sensitive film is made of monocrystalline silicon material.

Alternatively or optionally, a thickness of the pressure-sensitive film is 10 µm-30 µm.

According to the MEMS pressure sensing element, pressure sensitivity and electrical detection are separated, the pressure-sensitive film is exposed in air, the capacitor structures are disposed in the sealed cavity defined by the pressure-sensitive film and the substrate, and the movable electrode plates of the capacitor structures can be driven by the pressure-sensitive film. In this way, not only is a pressure-sensitive function finished, but also external electromagnetic interferences on the capacitor structures are shielded.

The inventors of the present invention have found that there is no MEMS pressure sensing element that can shield the external electromagnetic interferences outside the capacitors in the prior art. Thus, the technical task to be realized by the present invention or the technical problem to be solved is unintended or unpredicted by those skilled in the art, so the present invention is a new technical solution.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

FIGS. 1-4 introduce a first embodiment of an MEMS pressure sensing element of the present invention, which comprises:

a substrate 1 provided with a groove, a pressure-sensitive film 5 disposed above the substrate 1, the pressure-sensitive film 5 sealing an opening of the groove to form a sealed cavity 500; and a movable electrode plate and a fixed electrode plate which are located in the scaled cavity 500 and form a capacitor structure, wherein the fixed electrode plate is fixed on a bottom wall of the groove of the substrate 1, and the movable electrode plate is suspended above the fixed electrode plate and opposite to the fixed electrode plate; and the pressure-sensitive film 5 is connected to the movable electrode plate so as to drive the movable electrode plate to move under the action of an external pressure.

Figure 1:
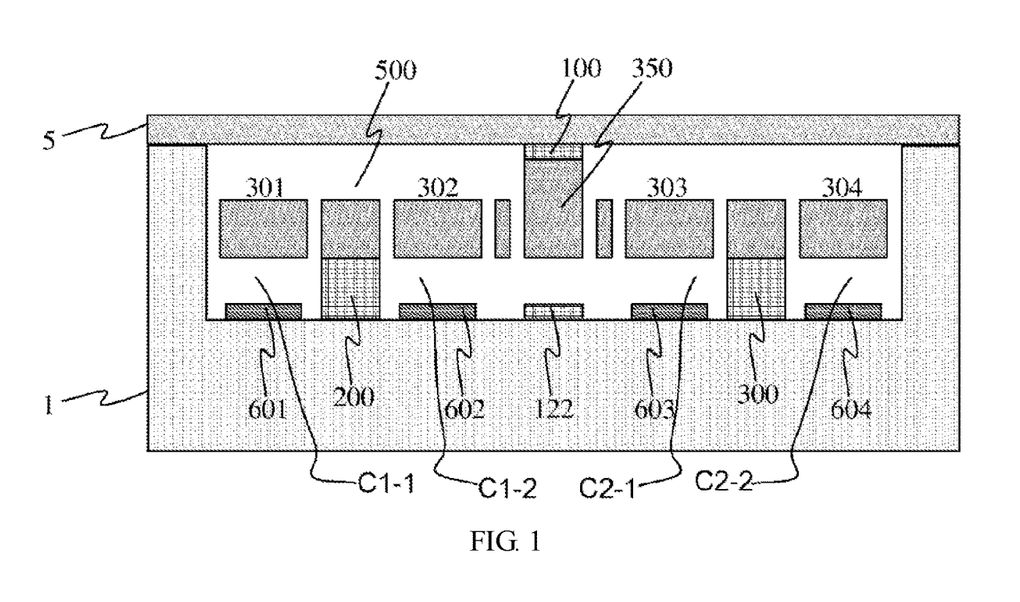
FIG. 1 is a schematic diagram of a first embodiment of an MEMS pressure sensing element of the present invention.
Figure 2:
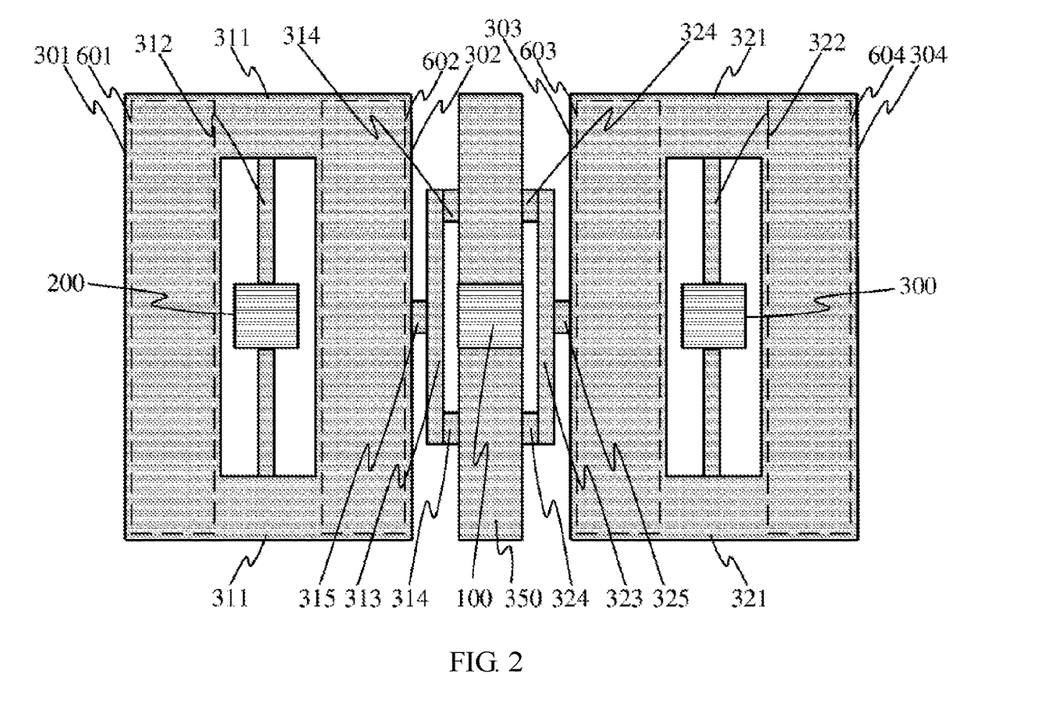
FIG. 2 is a plan view of a capacitor structure of the first embodiment of the MEMS pressure sensing element of the present invention.

Capacitor structures of the MEMS pressure sensing element of the present invention are introduced referring to FIGS. 1 and 2.

The fixed electrode plate comprises a first fixed electrode plate 601, a second fixed electrode plate 602, a third fixed electrode plate 603 and a fourth fixed electrode plate 604, which are sequentially arranged in parallel.

The movable electrode plate comprises a first torsion mass block, a pressure conduction part 350 and a second torsion mass block which are sequentially disposed in parallel, wherein the first torsion mass block and the second torsion mass block are symmetric about the pressure conduction part 350.

The pressure conduction part 350 is strip-shaped, and a central part thereof is fixedly connected to that of the pressure-sensitive film 5 by a first anchoring point 100. The pressure conduction part 350 is connected to the first torsion mass block by a first elastic connecting part, and is connected to the second torsion mass block by a second elastic connecting part. By the above arrangement, the central part of the movable electrode plate is connected to the pressure-sensitive film 5 by the first anchoring point 100. Under the drive of the pressure-sensitive film 5, the first torsion mass block and the second torsion mass block are subjected to torsion movement by the first elastic connecting part and the second elastic connecting part.

The first torsion mass block comprises a first rectangular frame structure and a third elastic beam 312; the first rectangular frame structure comprises a first movable electrode plate 301 and a second movable electrode plate 302 which are respectively parallel with the pressure conduction part 350, and two fifth connecting arms 311 respectively perpendicular to the pressure conduction part 350; the third elastic beam 312 is connected to midpoints of the two fifth connecting arms 311, and the center of the third elastic beam is fixedly connected to the bottom wall of the groove of the substrate 1 by the second anchoring point 200.

The second torsion mass block comprises a second rectangular frame structure and a fourth elastic beam 322; the second rectangular frame structure comprises a third movable electrode plate 303 and a fourth movable electrode plate 304 which are respectively parallel with the pressure conduction part 350, and two sixth connecting arms 321 respectively perpendicular to the pressure conduction part 350; the fourth elastic beam 322 is connected to midpoints of the two sixth connecting arms 321, and the center of the fourth elastic beam is fixedly connected to the bottom wall of the groove of the substrate 1 by the third anchoring point 300.

The first elastic connecting part comprises a first elastic beam 313, first connecting arms 314 and a second connecting arm 315; the first elastic beam 313 is parallel with the pressure conduction part 350; both ends of the first elastic beam 313 are connected to the pressure conduction part 350 by one first connecting arm 314 respectively, and the middle of the first elastic beam 313 is connected to the second movable electrode plate 302 of the first torsion mass block by the second connecting arm 315.

The second elastic connecting part comprises a second elastic beam 323, third connecting arms 324 and a fourth connecting arm 325; the second elastic beam 323 is parallel with the pressure conduction part 350; both ends of the second elastic beam 323 are connected to the pressure conduction part 350 by one third connecting arm 324 respectively, and the middle of the second elastic beam 323 is connected to the third movable electrode plate 303 of the second torsion mass block by the fourth connecting arm 325.

The first movable electrode plate 301 and the first fixed electrode plate 601 form a first capacitor structure C1-1, the second movable electrode plate 302 and the second fixed electrode plate 602 form a second capacitor structure C1-2, the third movable electrode plate 303 and the third fixed electrode plate 603 form a third capacitor structure C2-1 and the fourth movable electrode plate 304 and the fourth fixed electrode plate 604 form a fourth capacitor structure C2-2.

The first capacitor structure C1-1 and the fourth capacitor structure C2-2 are connected in parallel by metal leads and form a first group of capacitors C1; the second capacitor structure C1-2 and the third capacitor structure C2-1 are connected in parallel by metal leads and form a second group of capacitors C2; and the first group of capacitors C1 and the second group of capacitors C2 form a pair of differential capacitors.

The sealed cavity 500 is further provided a limiting bulge part 122 therein, and the limiting bulge part 122 is disposed on the bottom wall of the groove of the substrate 1 and below the pressure conduction part 350. The limiting bulge part 122 is used for limiting displacement of the pressure conduction part 350, and avoids element damage and function failure caused by contact between the movable electrode plate and the fixed electrode plate.

The first, the second and the third anchoring points 100, 200 and 300 are oxide preferably. The pressure-sensitive film 5 is made of monocrystalline silicon material preferably, and a thickness of the pressure-sensitive film 5 is 10 μm-30 μm preferably.

When external pressures act on the pressure-sensitive film 5, the pressure-sensitive film 5 will drive the movable electrode plate to move, and the distance between the movable electrode plate and the fixed electrode plate is caused to be changed. Therefore, capacitance change is caused. By detecting the capacitance change, detection on the external pressures can be realized. The pressure-sensitive film 5 is connected to the ground potential. Thus, not only is the detection on the external pressures realized, but also external electromagnetic interferences are shielded outside an electrical part, and a purpose of improving the precision of the MEMS pressure sensor is achieved.

Figure 3:
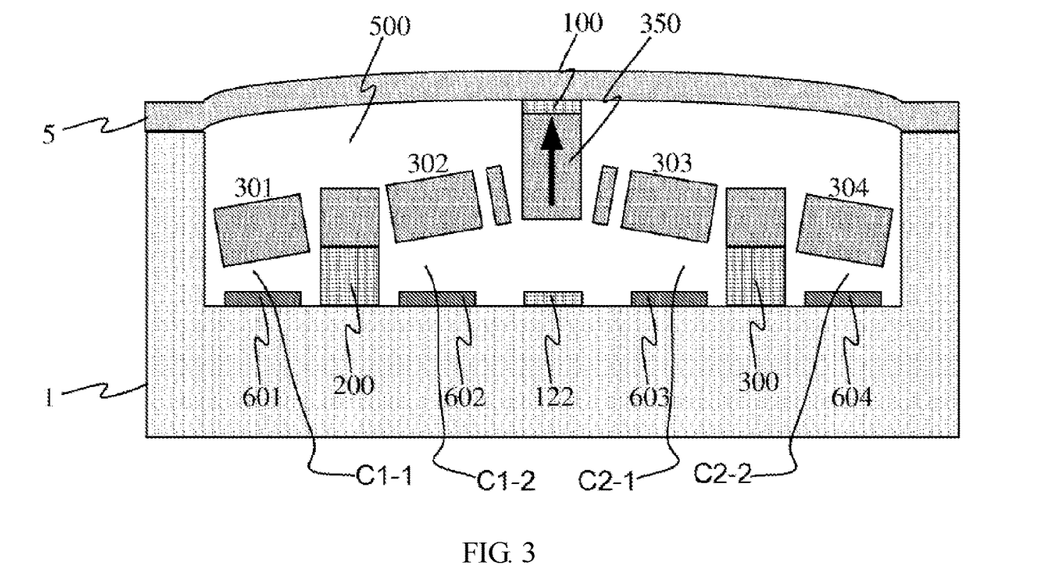
FIGS. 3-4 are state views of the MEMS pressure sensing element of the first embodiment of the present invention under the change of external pressures.
Figure 4:
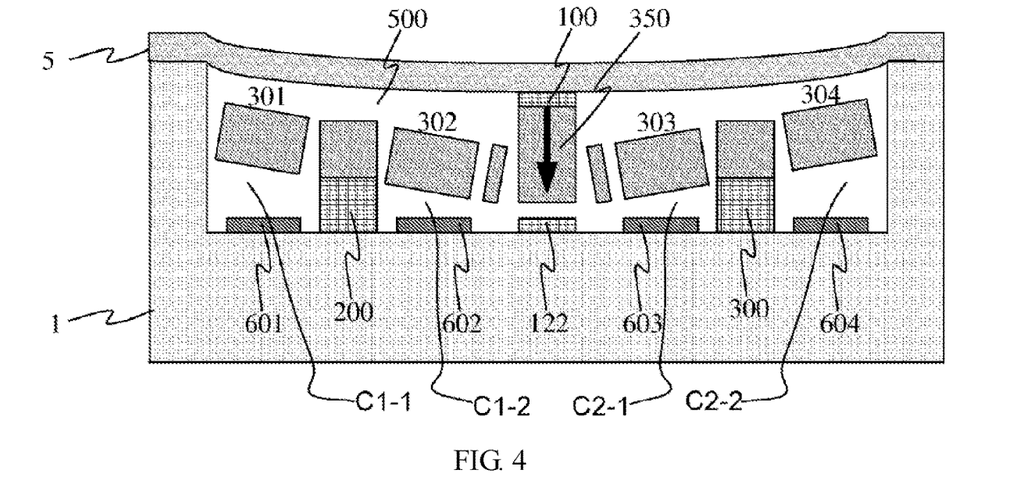

FIGS. 3 and 4 introduce a differential detection principle of the MEMS sensing element of the present invention.

Referring to FIG. 3, when the external pressures are reduced, the pressure-sensitive film 5 is bulged upwards, the pressure conduction part 350 is driven to move upwards, a distance between the second movable electrode plate 302 and the second fixed electrode plate 602 is increased, a distance between the third movable electrode plate 303 and the third fixed electrode plate 603 is increased, and as a result, the second capacitor structure C1-2 and the third capacitor structure C2-1 are reduced simultaneously. A distance between the first movable electrode plate 301 and the first fixed electrode plate 601 is reduced, a distance between the fourth movable electrode plate 304 and the fourth fixed electrode plate 604 is reduced, and as a result, the first capacitor structure C1-1 and the fourth capacitor structure C2-2 are increased simultaneously.

Referring to FIG. 4, when the external pressures are increased, the pressure-sensitive film 5 is bulged downwards, the pressure conduction part 350 is driven to move downwards, the distance between the second movable electrode plate 302 and the second fixed electrode plate 602 is reduced, the distance between the third movable electrode plate 303 and the third fixed electrode plate 603 is reduced, and as a result, the second capacitor structure C1-2 and the third capacitor structure C2-1 are increased simultaneously. The distance between the first movable electrode plate 301 and the first fixed electrode plate 601 is increased, the distance between the fourth movable electrode plate 304 and the fourth fixed electrode plate 604 is increased, and as a result, the first capacitor structure C1-1 and the fourth capacitor structure C2-2 are reduced simultaneously.

It can be seen that the first capacitor structure C1-1 and the fourth capacitor structure C2-2 are increased or reduced simultaneously, and the second capacitor structure C1-2 and the third capacitor structure C2-1 are increased or reduced simultaneously. The first capacitor structure C1-1 and the fourth capacitor structure C2-2 form a first group of capacitors C1, the second capacitor structure C1-2 and the third capacitor structure C2-1 form a second group of capacitors C2, and the first group of capacitors C1 and the second group of capacitors C2 form a pair of differential capacitors. By performing signal processing through a differential capacitor detection circuit, the external pressures can be measured.

FIGS. 5-18 introduce a manufacturing process for the MEMS pressure sensing element of the first embodiment.

Figure 5:
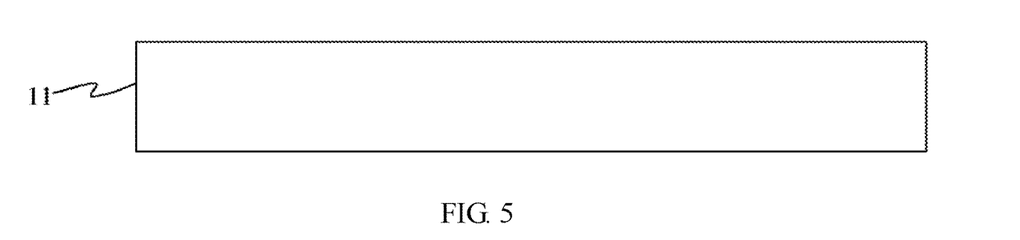
FIGS. 5-18 are schematic diagrams of a manufacturing process for the MEMS pressure sensing element of the first embodiment of the present invention.
Figure 6:
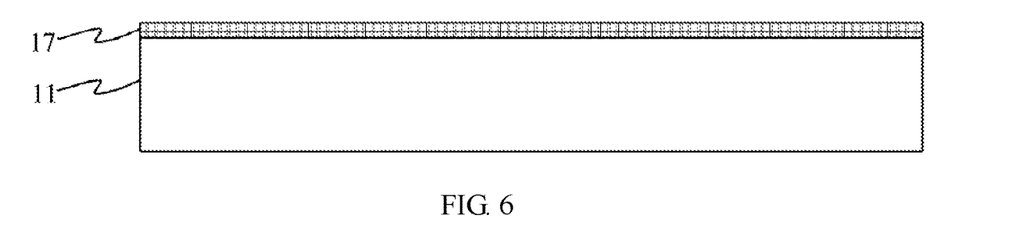
Figure 7:
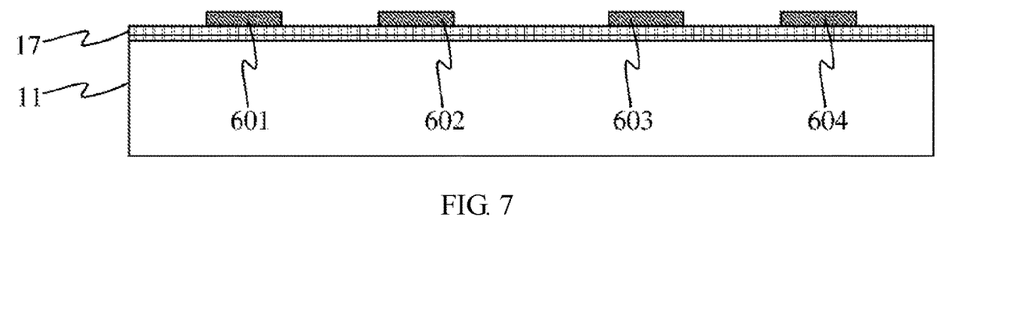

In S101, referring to FIG. 5, a first wafer 11 is provided; referring to FIG. 6, an oxide is deposited on the first wafer 11 as an isolating layer 17; referring to FIG. 7, a metal layer is deposited on the isolating layer 17; and the metal layer is patterned and etched to form a fixed electrode plate.

Figure 8:
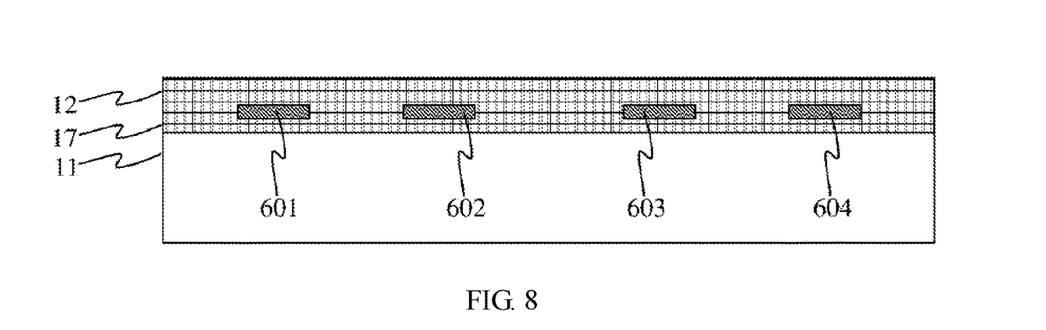
Figure 9:
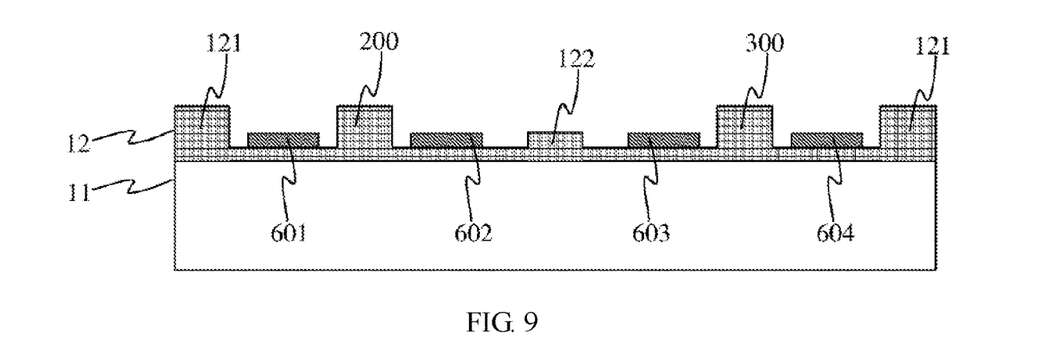

In S102, referring to FIG. 8, an oxide is deposited on the isolating layer 17 and the fixed electrode plate to be as a first oxide layer 12; referring to FIG. 9, the first oxide layer 12 is patterned and etched to expose the fixed electrode plate and form a third outer ring supporting part 121, a bonding step 200, a bonding step 300 and a limiting bulge part 122; and the bonding step 200 and the bonding step 300 respectively serve as fixed a anchoring point of a first torsion mass block and a second torsion mass block on a substrate.

Figure 10:
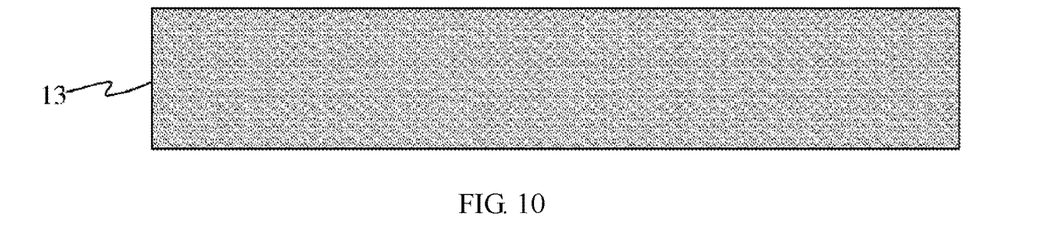
Figure 11:
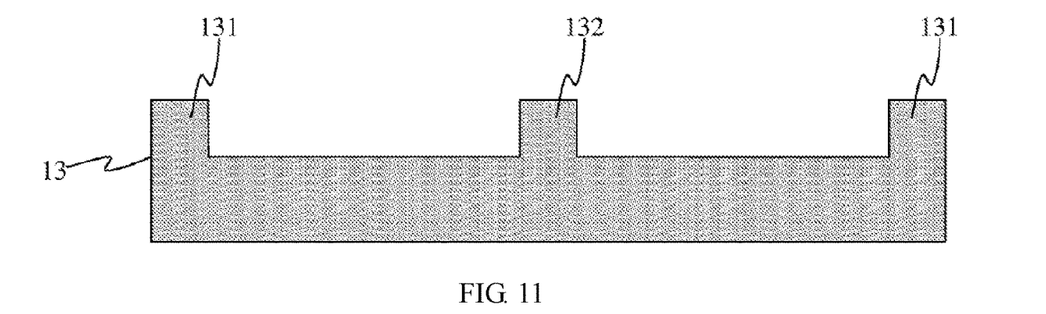

In S103, referring to FIG. 10, a second wafer 13 is provided; and referring to FIG. 11, the second wafer 13 is patterned and etched to form a first connecting part 132 located in the center of the front surface of the second wafer 13, and a first outer ring supporting part 131.

Figure 12:
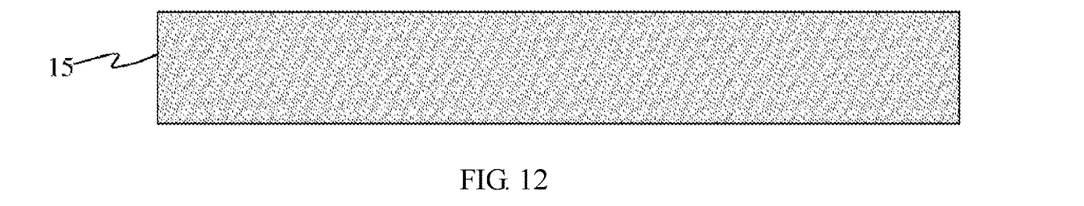
Figure 13:
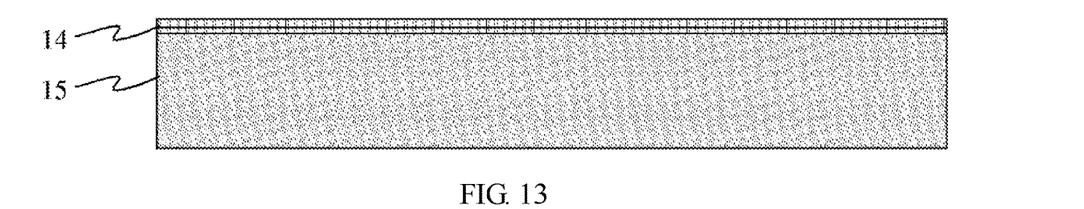
Figure 14:
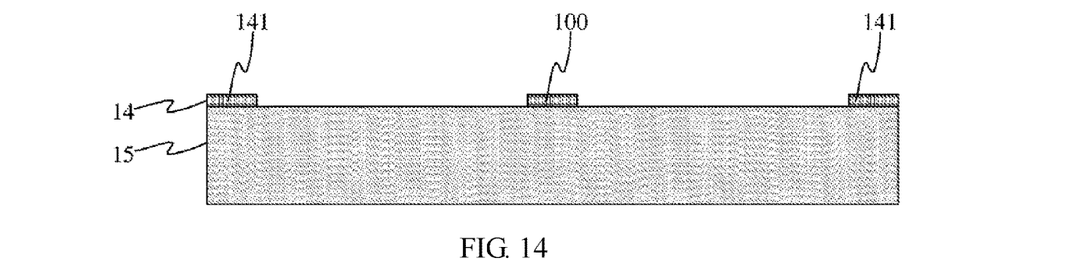

In S104, referring to FIG. 12, a third wafer 15 is provided; referring to FIG. 13, a second oxide layer 14 is deposited on the third wafer 15; and referring to FIG. 14, the second oxide layer 14 is patterned and etched to form a second connecting part 100 located in the center and a second outer ring supporting part 141; and the second connecting part 100 is a fixed anchoring point of a pressure conduction part on the pressure-sensitive film 5.

Figure 15:
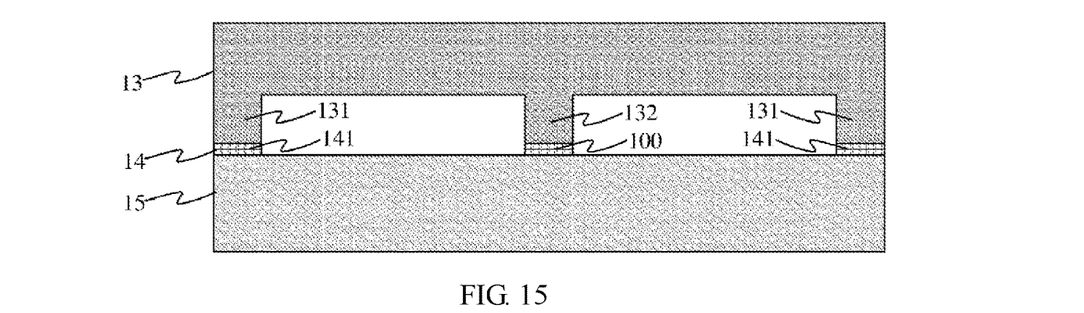

In S105, referring to FIG. 15, the second wafer 13 is turned over to bond the first connecting part 132 with the second connecting part 100 and to bond the first outer ring supporting part 131 with the second outer ring supporting part 141.

Figure 16:
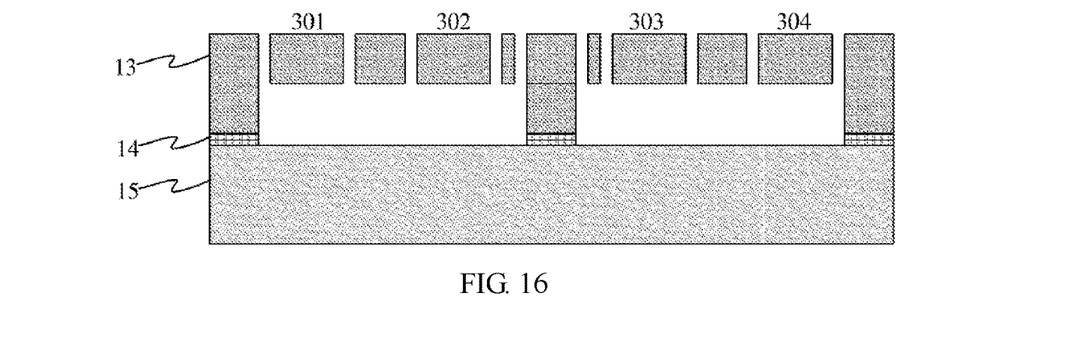

In S106, referring to FIG. 16, the second wafer 13 is thinned to a designed thickness, and the second wafer 13 is patterned and etched to form a movable electrode plate corresponding to the fixed electrode plate; the movable electrode plate comprises the first torsion mass block, the pressure conduction part and the second torsion mass block; and the etching here may be deep reactive ion etching (DRIE).

Figure 17:
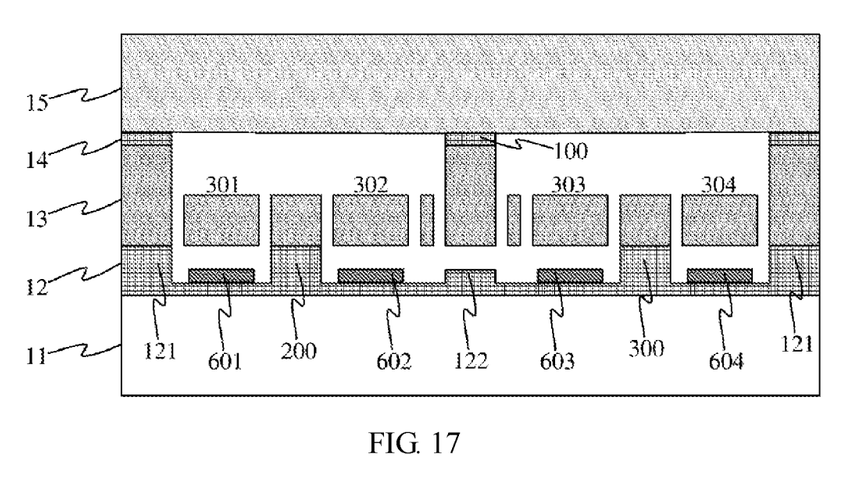

In S107, referring to FIG. 17, the third outer ring supporting part 121 and a back surface of the second wafer 13 are bonded to enable the movable electrode plate and the fixed electrode plate to form a capacitor structure; and after the bonding of this step is finished, the first wafer 11, the second wafer 15 and respective layers between the first wafer 11 and the third wafer 15 define a sealed cavity together, which packages the fixed electrode plate and the movable electrode plate therein.

Figure 18:
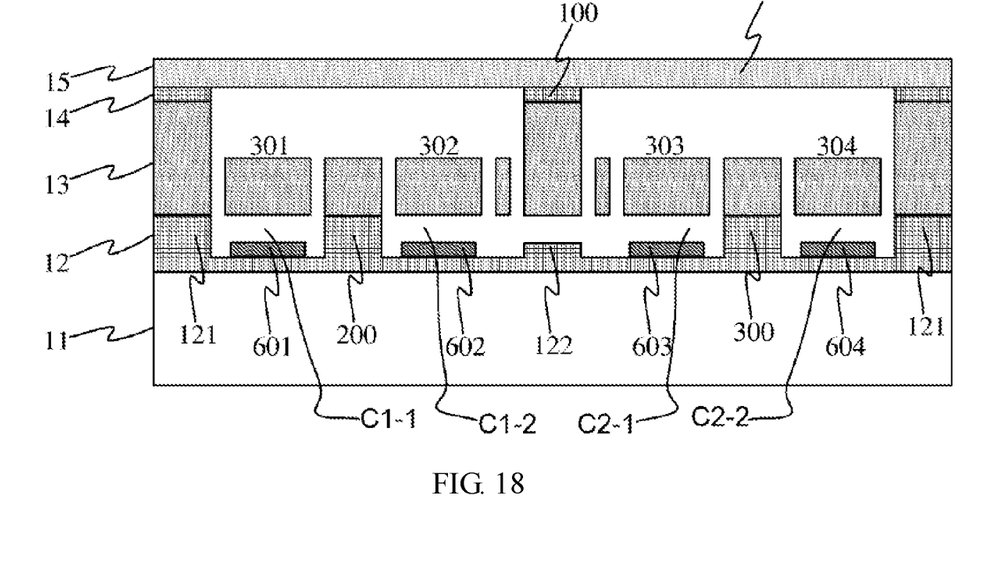

In S108, referring to FIG. 18, the third wafer 15 is thinned to form the pressure-sensitive film 5.

Figure 19:
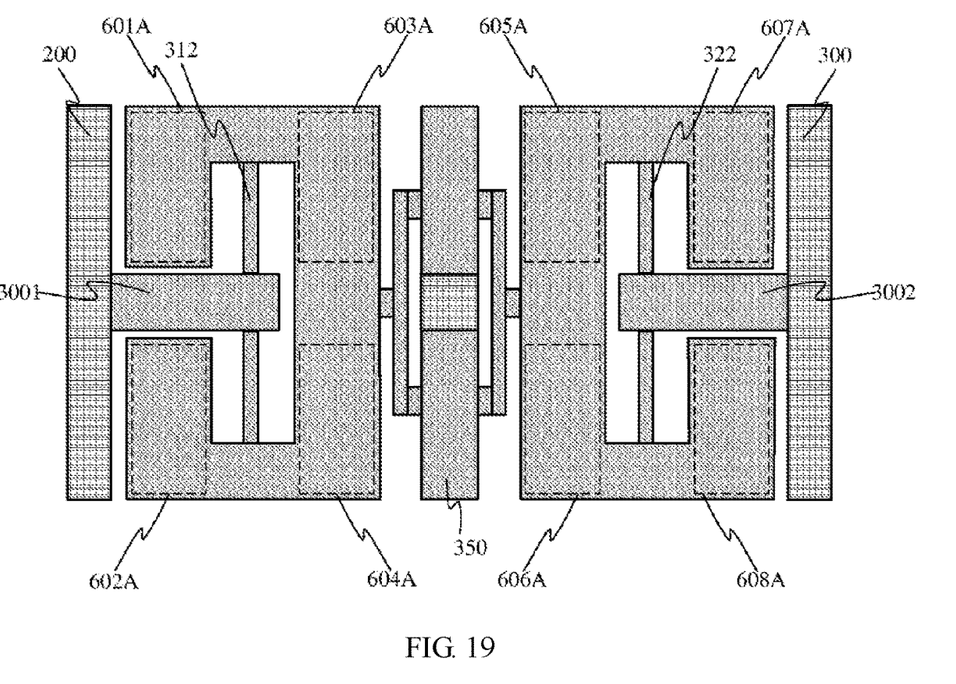
FIG. 19 is a plan view of a capacitor structure of a second embodiment of an MEMS pressure sensing element of the present invention.

A second embodiment of the MEMS pressure sensing element of the present invention is introduced referring to FIG. 19. It can be seen from the figure that: the first torsion mass block comprises a first rectangular frame structure, a third elastic beam 312 and a seventh connecting arm 3001; the middle of the first rectangular frame structure away from one side of the pressure conduction part 350 is provided with a first opening; the third elastic beam 312 is located in the first rectangular frame, and the two ends thereof are respectively connected to opposite sides of the first rectangular frame structure perpendicular to the pressure conduction part 350; one end of the seventh connecting arm 3001 is connected to a midpoint of the third elastic beam 312, and the other end thereof extends out of the first rectangular frame from the first opening to be connected to the second anchoring point 200; and the upper end of the second anchoring point 200 is connected to the pressure-sensitive film 5 and the lower end thereof is connected to the bottom wall of the groove of the substrate 1.

The second torsion mass block comprises a second rectangular frame structure, a fourth elastic beam 322 and an eighth connecting arm 3002; the middle of the second rectangular frame structure away from one side of the pressure conduction part 350 is provided with a second opening; the fourth elastic beam 322 is located in the second rectangular frame, and the two ends thereof are respectively connected to opposite sides of the second rectangular frame structure perpendicular to the pressure conduction part 350; one end of the eighth connecting arm 3002 is connected to a midpoint of the fourth elastic beam 322, and the other end thereof extends out of the second rectangular frame from the second opening to be connected to the third anchoring point 300; and the upper end of the third anchoring point 300 is connected to the pressure-sensitive film 5 and the lower end thereof is connected to the bottom wall of the groove of the substrate 1.

The fixed electrode plate comprises a first fixed electrode plate 601A, a second fixed electrode plate 602A, a third fixed electrode plate 603A and a fourth fixed electrode plate 604A, which are respectively located below four corners of the first rectangular frame, the first fixed electrode plate 601A and second fixed electrode plate 602A are relatively away from the pressure conduction part 350, and the third fixed electrode plate 603A and the fourth fixed electrode plate 604A are relatively closer to the pressure conduction part 350.

The fixed electrode plate further comprises a fifth fixed electrode plate 605A, a sixth fixed electrode plate 606A, a seventh fixed electrode plate 607A and a eighth fixed electrode plate 608A respectively located below four corners of the second rectangular frame, the fifth fixed electrode plate 605A and sixth fixed electrode plate 606A are relatively closer to the pressure conduction part 350, and the seventh fixed electrode plate 607A and eighth fixed electrode plate 608A are relatively away from the pressure conduction part 350.

The first to the eighth fixed electrode plate (601A-608A) and the torsion mass blocks on corresponding parts thereabove form a first to a eighth capacitor structure, wherein the first capacitor structure, the second capacitor structure, seventh and the eighth capacitor structure are connected in parallel by leads and form a first group of capacitors; the third capacitor structure, the fourth capacitor structure, the fifth capacitor structure and the sixth capacitor structure are connected in parallel by leads and form a second group of capacitors; and the first group of capacitors and the second group of capacitors form a pair of differential capacitors.

In the second embodiment, supporting anchoring points of the first torsion mass block and the second torsion mass block are pulled outside the mass blocks, and the two ends of the anchoring points are connected to the pressure-sensitive film and the substrate respectively, such that the anchoring points are in a non-suspension state, and the bonding quality and connecting strength can be ensured when the torsion mass blocks and the substrate are bonded. Therefore, the second embodiment is easier to implement in process, without affecting a movement mode of the pressure-sensitive film.

According to the present invention, metal electrodes are manufactured on a substrate as the fixed electrode plates, and then oxide layer bulges are etched to reserve a movement space for bonding of the movable electrode plates. A top layer of the element is provided with the pressure-sensitive film. The external pressures will cause the pressure-sensitive film to move up and down. A movable electrode plate layer is disposed under the pressure-sensitive film, and middle parts of the movable electrode plates and that of the pressure-sensitive film are bonded together. When a pressure acts on the pressure-sensitive film, the pressure-sensitive film will drive the movable electrode plate to move, and further capacitance change between the movable electrode plate and the metal electrode on the substrate is caused to realize detection on the external pressure.

Although some specific embodiments of the present invention have been demonstrated in detail with examples, it should be understood by a person skilled in the art that the above examples are only intended to be illustrative but not to limit the scope of the present invention.

What is claimed is:

1. An MEMS pressure sensing element, comprising:
a substrate provided with a groove;
a pressure-sensitive film disposed above the substrate, the pressure-sensitive film sealing an opening of the groove to form a sealed cavity; and
a movable electrode plate and a fixed electrode plate which are located in the sealed cavity and form a capacitor structure,
the fixed electrode plate is fixed on a bottom wall of the groove of the substrate, and the movable electrode plate is suspended above the fixed electrode plate and opposite to the fixed electrode plate; and the pressure-sensitive film is connected to the movable electrode plate so as to drive the movable electrode plate to move under the action of an external pressure,
wherein
the movable electrode plate comprises a first torsion mass block, a pressure conduction part and a second torsion mass block which are sequentially disposed in parallel, wherein the first torsion mass block and the second torsion mass block are symmetric about the pressure conduction part;
the pressure conduction part is connected to the first torsion mass block by a first elastic connecting part, and is connected to the second torsion mass block by a second elastic connecting part;
a central part of the pressure conduction part is fixedly connected to that of the pressure-sensitive film by a first anchoring point; a central part of the first torsion mass block is fixedly connected to the bottom wall of the groove of the substrate by a second anchoring point; and a central part of the second torsion mass block is fixedly connected to the bottom wall of the groove of the substrate by a third anchoring point.

2. The element according to claim 1, wherein
the first elastic connecting part comprises a first elastic beam, first connecting arms and a second connecting arm; the second elastic connecting part comprises a second elastic beam, third connecting arms and a fourth connecting arm; the first elastic beam and the second elastic beam are respectively parallel with the pressure conduction part;
both ends of the first elastic beam are connected to the pressure conduction part by one first connecting arm respectively, and the middle of the first elastic beam is connected to the first torsion mass block by the second connecting arm; and
both ends of the second elastic beam are connected to the pressure conduction part by one third connecting arm respectively, and the middle of the second elastic beam is connected to the second torsion mass block by the fourth connecting arm.

3. The element according to claim 1, wherein
the first torsion mass block comprises a first rectangular frame structure and a third elastic beam; the first rectangular frame structure comprises a first movable electrode plate and a second movable electrode plate which are respectively parallel with the pressure conduction part, and two fifth connecting arms respectively perpendicular to the pressure conduction part; the third elastic beam is connected to midpoints of the two fifth connecting arms, and the center of the third elastic beam is fixedly connected to the bottom wall of the groove of the substrate by the second anchoring point;
the second torsion mass block comprises a second rectangular frame structure and a fourth elastic beam; the second rectangular frame structure comprises a third movable electrode plate and a fourth movable electrode plate which are respectively parallel with the pressure conduction part, and two sixth connecting arms respectively perpendicular to the pressure conduction part; the fourth elastic beam is connected to midpoints of the two sixth connecting arm, and the center of the fourth elastic beam is fixedly connected to the bottom wall of the groove of the substrate by the third anchoring point;

the fixed electrode plate comprises a first, a second, a third and a fourth fixed electrode plate, and the first, the second, the third and the fourth fixed electrode plate correspond to the first, the second, the third and the fourth movable electrode plate respectively to form a first, a second, a third and a fourth capacitor structure.

4. The element according to claim 3, wherein
the first capacitor structure and the fourth capacitor structure are connected in parallel by a lead and form a first group of capacitors; the second capacitor structure and the third capacitor structure are connected in parallel by a lead and form a second group of capacitors; and the first group of capacitors and the second group of capacitors form a pair of differential capacitors.

5. The element according to claim 1, wherein
the first torsion mass block comprises a first rectangular frame structure, a third elastic beam and a seventh connecting arm; the middle of the first rectangular frame structure away from one side of the pressure conduction part is provided with a first opening; the third elastic beam is located in the first rectangular frame, and the two ends thereof are respectively connected to opposite sides of the first rectangular frame structure perpendicular to the pressure conduction part; one end of the seventh connecting arm is connected to a midpoint of the third elastic beam, and the other end thereof extends out of the first rectangular frame from the first opening to be connected to the second anchoring point; the upper end of the second anchoring point is connected to the pressure-sensitive film and the lower end thereof is connected to the bottom wall of the groove of the substrate;

the second torsion mass block comprises a second rectangular frame structure, a fourth elastic beam and an eighth connecting arm; the middle of the second rectangular frame structure away from one side of the pressure conduction part is provided with a second opening; the fourth elastic beam is located in the second rectangular frame, and the two ends thereof are respectively connected to opposite sides of the second rectangular frame structure perpendicular to the pressure conduction part; one end of the eighth connecting arm is connected to a midpoint of the fourth elastic beam, and the other end thereof extends out of the second rectangular frame from the second opening to be connected to the third anchoring point; and the upper end of the third anchoring point is connected to the pressure-sensitive film and the lower end thereof is connected to the bottom wall of the groove of the substrate.

6. The element according to claim 5, wherein
the fixed electrode plate comprises a first, a second, a third and a fourth fixed electrode plate which are respectively located below four corners of the first rectangular frame, the first fixed electrode plate and the second fixed electrode plate are relatively away from the pressure conduction part, and the third fixed electrode plate and the fourth fixed electrode plate are relatively closer to the pressure conduction part;

the fixed electrode plate further comprises a fifth, a sixth, a seventh and a eighth fixed electrode plate respectively located below four corners of the second rectangular frame, the fifth fixed electrode plate and the sixth fixed electrode plate are relatively closer to the pressure conduction part, and the seventh fixed electrode plate and the eighth fixed electrode plate are relatively away from the pressure conduction part;

the first fixed electrode plate to the eighth fixed electrode plate and the torsion mass blocks on corresponding parts thereabove form a first capacitor structure to a eighth capacitor structure, wherein the first, the second, the seventh and the eighth capacitor structure are connected in parallel by a lead and form a first group of capacitors; and the third, the fourth, the fifth and the sixth capacitor structures are connected in parallel by a lead and form a second group of capacitors; and the first group of capacitors and the second group of capacitors form a pair of differential capacitors.

7. The element according to claim 1, wherein the sealed cavity is further provided a limiting bulge part therein, and the limiting bulge part is disposed on the bottom wall of the groove of the substrate and below the pressure conduction part.

8. The element according to claim 1, wherein the pressure-sensitive film is made of monocrystalline silicon material.

9. The element according to claim 1, wherein a thickness of the pressure-sensitive film is 10 μm-30 μm.

* * * * *